(12) United States Patent
Miyamoto

(10) Patent No.: US 10,141,357 B2
(45) Date of Patent: Nov. 27, 2018

(54) PHOTOSENSOR SUBSTRATE

(71) Applicant: SHARP KABUSHIKI KAISHA, Sakai, Osaka (JP)

(72) Inventor: Tadayoshi Miyamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/565,256

(22) PCT Filed: Apr. 5, 2016

(86) PCT No.: PCT/JP2016/061082
§ 371 (c)(1),
(2) Date: Oct. 9, 2017

(87) PCT Pub. No.: WO2016/163347
PCT Pub. Date: Oct. 13, 2016

(65) Prior Publication Data
US 2018/0061876 A1 Mar. 1, 2018

(30) Foreign Application Priority Data
Apr. 10, 2015 (JP) ................................ 2015-081176

(51) Int. Cl.
*H01L 27/146* (2006.01)
*G01T 7/00* (2006.01)
(Continued)

(52) U.S. Cl.
CPC ........ *H01L 27/14614* (2013.01); *G01T 1/241* (2013.01); *G01T 7/00* (2013.01);
(Continued)

(58) Field of Classification Search
CPC ......... H01L 27/14614; H01L 27/14616; H01L 27/14623
See application file for complete search history.

(56) References Cited

U.S. PATENT DOCUMENTS 6,243,155 B1 6/2001 Zhang et al.
2002/0060322 A1 5/2002 Tanabe et al.
(Continued)

FOREIGN PATENT DOCUMENTS

JP H11-125841 A 5/1999
JP 2002-217206 A 8/2002
(Continued)

*Primary Examiner* — Errol Fernandes
(74) *Attorney, Agent, or Firm* — ScienBiziP, P.C.

(57) ABSTRACT

A photosensor substrate achieves TFT property stabilization and further improvement in sensor performance. The photosensor substrate includes a substrate 7, a photoelectric transducer 4, and a transistor 2. The transistor 2 includes a semiconductor layer 22, a drain electrode 23 and a source electrode 21 facing each other in a direction parallel to a plane of the substrate with the semiconductor layer 22 interposed therebetween, a gate insulating film 15 covering the semiconductor layer 22, the drain electrode 23, and the source electrode 21, and a gate electrode 24 facing the semiconductor layer 22 with the gate insulating film 15 interposed therebetween. The photoelectric transducer 4 includes a lower electrode 41 connected to the drain electrode 23 via a contact hole CH1 provided in the gate insulating film 15, a semiconductor film 42, and an upper electrode 43.

9 Claims, 11 Drawing Sheets

(51) Int. Cl.
  *H01L 29/786* (2006.01)
  *H01L 27/144* (2006.01)
  *G01T 1/24* (2006.01)
  *H01L 31/10* (2006.01)

(52) U.S. Cl.
  CPC .......... *H01L 27/144* (2013.01); *H01L 27/146* (2013.01); *H01L 27/14616* (2013.01); *H01L 27/14623* (2013.01); *H01L 27/14663* (2013.01); *H01L 27/14689* (2013.01); *H01L 29/786* (2013.01); *H01L 29/7869* (2013.01); *H01L 31/10* (2013.01)

(56) References Cited

U.S. PATENT DOCUMENTS

| | | |
|---|---|---|
| 2012/0319183 A1 | 12/2012 | Yamazaki et al. |
| 2016/0118253 A1 | 4/2016 | Takata et al. |

FOREIGN PATENT DOCUMENTS

| | | |
|---|---|---|
| JP | 2002-353140 A | 12/2002 |
| JP | 2003-158253 A | 5/2003 |
| JP | 2010-003766 A | 1/2010 |
| JP | 2013-021315 A | 1/2013 |
| JP | 2013-156119 A | 8/2013 |
| JP | 2015-018896 A | 1/2015 |

PHOTOSENSOR SUBSTRATE

TECHNICAL FIELD

The present invention relates to a photosensor substrate including a photoelectric transducer.

BACKGROUND ART

A photosensor substrate for a flat panel can be formed by arraying, on a substrate, switching elements and photoelectric transducers in a matrix form. Such a photosensor substrate is applicable to a contact image sensor, an X-ray imaging display device, and the like. For example, Patent Literature 1 describes forming a two dimensional photovoltaic device including a metal-insulator-semiconductor (MIS) sensor in combination with a thin film transistor (TFT).

Patent Literature 2 discloses a sensor substrate including a plurality of photodiodes (photoelectric transducers) provided on a substrate, and TFTs each functioning as a driver element. The sensor substrate includes a wavelength conversion layer that converts a wavelength of incident radial rays to fall within a sensitivity range of the photoelectric transducers. The wavelength conversion layer is made of a scintillator (fluorescent material) that converts X-rays to visible rays.

A flat panel X-ray imaging display device (flat panel detector (FPD)) of an indirect conversion type, which is configured to convert X-rays to visible rays by means of a scintillator and detect the converted rays, has been attracting attention with expected application in medical industries and the like.

A FPD can be of the indirect conversion type, or can be of a direct conversion type configured to convert X-rays directly to electric charges by means of an X-ray detecting element typically exemplified by Se. The FPD of the indirect conversion type achieves higher quantum efficiency and a higher signal to noise ratio (S/N ratio) than that of the direct conversion type. The FPD of the indirect conversion type thus enables fluoroscopy and photographing with a fewer exposed dose.

CITATION LIST

Patent Literatures

Patent Literature 1: JP 2003-158253 A
Patent Literature 2: JP 2013-156119 A

SUMMARY OF INVENTION

Technical Problems

The inventor has found that, in the conventional photosensor substrate configured as described above, etching for formation of a photoelectric conversion layer after formation of the TFT influences a TFT property. The inventor has further found that the TFT property of the conventional configuration is also influenced by height difference of a semiconductor layer or an insulating film due to thickness of a gate electrode of the TFT. These influences on the TFT property can disturb improvement in sensor performance such as increase in size of a detection surface or improvement in detection accuracy.

In view of the above, the present application discloses a photosensor substrate achieving TFT property stabilization and further improvement in sensor performance.

Solution to Problems

A photosensor substrate according to an embodiment of the present invention includes: a substrate; a plurality of photoelectric transducers disposed on the substrate; and transistors connected to the photoelectric transducers, respectively. The transistors each include a semiconductor layer supported by the substrate, a drain electrode and a source electrode facing each other in a direction parallel to a plane of the substrate, with the semiconductor layer interposed therebetween, a gate insulating film covering the semiconductor layer, the drain electrode, and the source electrode, and a gate electrode facing the semiconductor layer with the gate insulating film interposed therebetween. The photoelectric transducers each include a lower electrode connected to the drain electrode or the source electrode via a contact hole provided in the gate insulating film, a semiconductor film in contact with the lower electrode, and an upper electrode facing the lower electrode with the semiconductor film interposed therebetween.

Advantageous Effects of Invention

The photosensor substrate according to the present disclosure achieves TFT property stabilization and further improvement in sensor performance.

DESCRIPTION OF EMBODIMENTS

Figure 1:
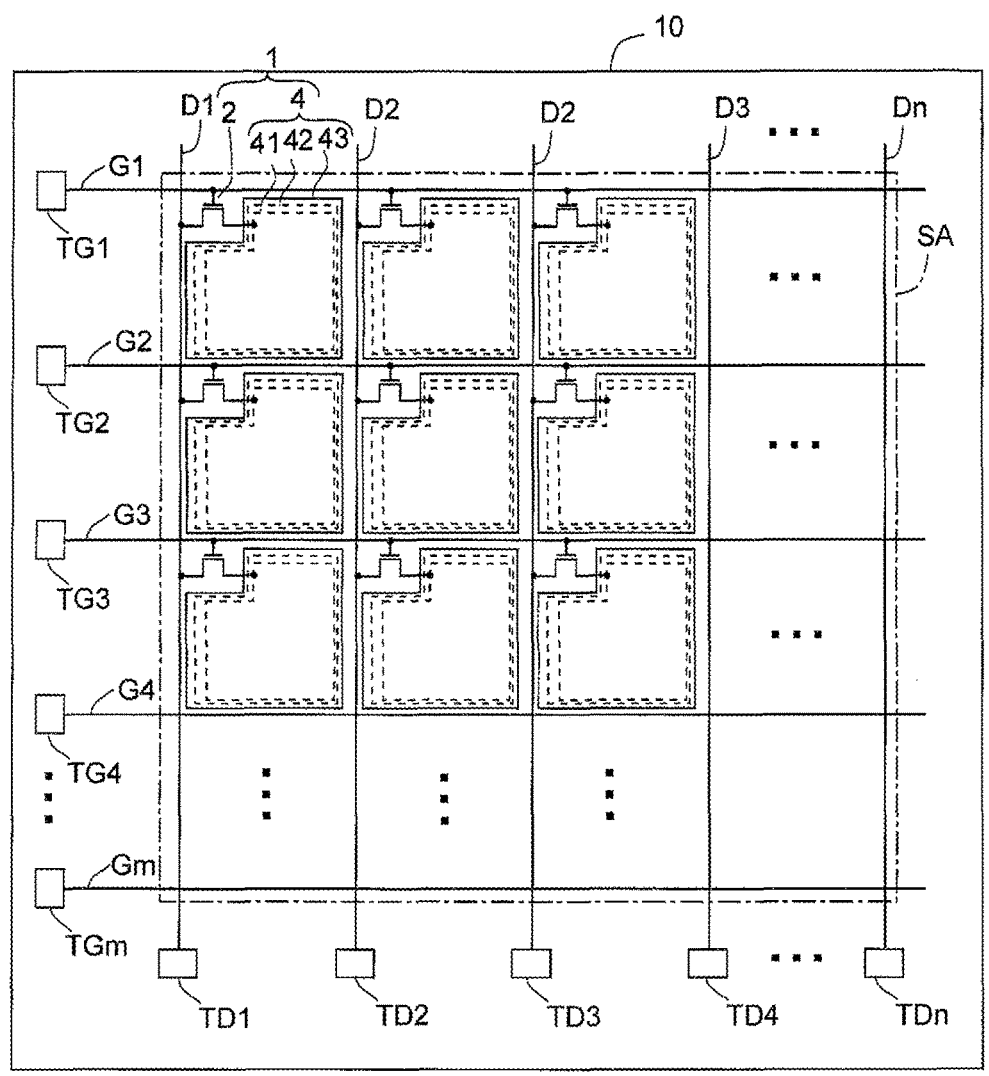
FIG. 1 is a plan view depicting an exemplary configuration of a photosensor substrate according to the present embodiment.

A photosensor substrate according to an embodiment of the present invention includes: a substrate; a plurality of photoelectric transducers disposed on the substrate; and transistors connected to the photoelectric transducers, respectively. The transistors each include a semiconductor layer supported by the substrate, a drain electrode and a source electrode facing each other in a direction parallel to a plane of the substrate, with the semiconductor layer interposed therebetween, a gate insulating film covering the semiconductor layer, the drain electrode, and the source electrode, and a gate electrode facing the semiconductor layer with the gate insulating film interposed therebetween. The photoelectric transducers each include a lower electrode connected to the drain electrode or the source electrode via a contact hole provided in the gate insulating film, a semiconductor film in contact with the lower electrode, and an upper electrode facing the lower electrode with the semiconductor film interposed therebetween.

In this configuration, the gate electrode is provided on the gate insulating film covering semiconductor layer, the source electrode, and the drain electrode of the transistor, and is positioned to face the semiconductor layer. The gate electrode reduces process damage (e.g. damage caused by etching) to the semiconductor layer upon formation of the semiconductor film of the photoelectric transducer on the gate insulating film. This improves stability or reliability of a transistor property to improve sensor performance.

The semiconductor layer, the source electrode, and the drain electrode of the transistor, as well as the gate insulating film are provided between the gate electrode and the substrate. The semiconductor layer, the source electrode, and the drain electrode of the transistor, or the gate insulating film are thus not influenced by height difference due to thickness of the gate electrode. The gate electrode is thus enhanced in design flexibility of the thickness. The gate electrode can enable decrease in resistance and the like, to facilitate sensor performance improvement such as increase in size of a detection surface or improvement in detection accuracy.

Optionally, the semiconductor layer of the transistor has a surface close to the substrate and in contact with an end of the source electrode and an end of the drain electrode. In this configuration, the semiconductor layer is formed between the source electrode and the drain electrode facing each other, after the drain electrode and the source electrode are formed. This eliminates process damage to the semiconductor layer upon formation of the source electrode and the drain electrode. The source electrode and the drain electrode are thus enhanced in design flexibility of thickness thereof. This configuration also achieves further improvement in stability or reliability of the transistor property.

Optionally, the transistor further includes an insulating layer provided on a surface far from the substrate, of the semiconductor layer. In this case, the insulating layer can be in contact with an end of the source electrode and an end of the drain electrode.

The insulating layer provided on the semiconductor layer reduces influence of process damage on the semiconductor layer upon formation of the source electrode and the drain electrode. The source electrode and the drain electrode are thus enhanced in design flexibility of thickness thereof. This configuration also achieves further improvement in stability or reliability of the transistor property.

The gate electrode of the transistor and the lower electrode of the photoelectric transducer are disposed at an identical layer level. The gate electrode and the lower electrode can thus be formed in an identical step. In this case, the gate electrode is positioned to face the semiconductor layer of the transistor upon formation of the semiconductor layer on the lower electrode, to efficiently reduce process damage of etching and the like to the semiconductor layer.

The photosensor substrate optionally further includes an interlayer insulating film provided farther from the substrate than the gate insulating film, and covering the gate electrode. The lower electrode of the photoelectric transducer can be provided on the interlayer insulating film in this case. The interlayer insulating film further reduces process damage, to the transistor, of etching and the like upon formation of the photoelectric transducer.

The photosensor substrate can further includes an extended gate electrode disposed at an identical layer level with the lower electrode and connected to the gate electrode via a contact hole provided in the interlayer insulating film. This configuration enables decrease in resistance of the gate electrode.

The photoelectric transducer optionally extends to face the gate electrode with the interlayer insulating film interposed therebetween. This configuration achieves an expanded light receiving surface of the photoelectric transducer. This also achieves further reduction of process damage, to the semiconductor layer of the transistor, of etching and the like upon formation of the photoelectric transducer.

The photosensor substrate optionally further includes a light shielding film provided between the substrate and the transistor. This configuration reduces influence on the transistor property, of light directed toward the photoelectric transducer or the transistor through the substrate.

The semiconductor layer of the transistor can include an oxide semiconductor. The oxide semiconductor has higher mobility or lower leakage current than a semiconductor made of amorphous silicon (noncrystalline, a-Si), polysilicon (polycrystalline, p-Si), or the like. Adoption of the transistor including the oxide semiconductor enables sensor performance improvement such as increase in size or improvement in definition of the detection surface of the photosensor substrate.

The inventor has found that the transistor including the semiconductor layer made of the oxide semiconductor leads to further increase in transistor property change due to etching for formation of the photoelectric transducer. Adoption of the above configuration to the transistor including the oxide semiconductor thus further enhances the effect of improvement in stability or reliability of the transistor property.

Embodiments of the present invention will be described in detail below with reference to the drawings. Identical or corresponding portions in the drawings will be denoted by identical reference signs and will not be described repeatedly. For clearer description, the drawings to be referred to hereinafter may depict simplified or schematic configurations or may not depict some of constructional elements. The constructional elements in each of the drawings may not necessarily be depicted in actual dimensional ratios.

<Embodiment 1>

(Exemplary Configuration of Photosensor Substrate)

FIG. 1 is a plan view depicting an exemplary configuration of a photosensor substrate according to the present embodiment. FIG. 1 depicts a photosensor substrate 10 provided with a plurality of gate lines G1, G2, . . . and Gm (hereinafter, collectively called gate lines G when not distinguished from one another) extending in a first direction (a lateral direction) and a plurality of data lines D1, D2, . . . and Dn (hereinafter, collectively called data lines D when not distinguished from one another) extending in an exemplary second direction (a longitudinal direction) crossing the gate lines G. The gate lines G and the data lines D have intersection points each provided with a TFT 2 exemplifying a transistor. The TFTs 2 are each connected to the gate line G, the data line D, and a lower electrode 41. The lower electrode 41 is provided for a photodiode 4 exemplifying a photoelectric transducer.

The lower electrode 41 is disposed in an area surrounded with the two adjacent gate lines G and the two adjacent data lines D. There are provided a semiconductor film 42 and an upper electrode 43 each overlapped with the lower electrode 41. The lower electrode 41, the semiconductor film 42, and the upper electrode 43 being stacked configure the photodiode 4. The lower electrode 41, the semiconductor film 42, and the upper electrode 43 are overlapped in the mentioned order in a direction perpendicular to a plane of the photosensor substrate 10.

One set of the TFT 2 and the photodiode 4 configures a single sensor unit 1. The sensor units 1 are arrayed in a matrix form along the plane of the photosensor substrate 10. The sensor units 1 are each disposed in the area surrounded with the two adjacent gate lines G and the two adjacent data lines D. Each of the sensor units 1 corresponds to a single pixel.

The photodiode 4 in each of the sensor units 1 converts light applied to the semiconductor film 42 to electric charges (electron holes) 9. Specifically, light applied to the semiconductor film 42, which receives voltage and is in a reverse bias state, is converted to electric charges excited in a depletion layer. The converted electric charges are extracted to the outside via the data line D when a signal supplied from the gate line G brings the TFT into an ON state. This causes output of an electric signal according to an amount of received light. The photosensor substrate 10 converts the amount of light applied to each of the sensor units 1 to a current amount to be outputted as an electric signal or an image. This achieves acquisition of an image having pixels respectively corresponding to the sensor units 1.

The gate lines G and the data lines D are led out of a sensor area SA. The sensor area SA in the photosensor substrate 10 is provided with the sensor units 1 when viewed in a direction perpendicular to the substrate (along a normal line of the substrate), where light is detected. Outside the sensor area, the gate lines G1 to Gm are connected to terminal parts TG1 to TGm, respectively, (hereinafter, collectively called terminal parts TG when not distinguished from one another), whereas the data lines D1 to Dn are connected to terminal parts TD1 to TDn, respectively (hereinafter, collectively called terminal parts TD when not distinguished from one another).

The terminal part TG of each of the gate lines G can be connected with a circuit configured to output a drive signal supplied to the gate line G. The terminal part TD of each of the data lines D can be connected with a circuit configured to process a signal outputted from the data line D (e.g. an amplifier configured to amplify a signal or an A/D converter configured to perform A/D conversion of a signal (conversion between an analog signal and a digital signal)).

(Detailed Exemplary Configuration of Sensor Unit)

Figure 2:
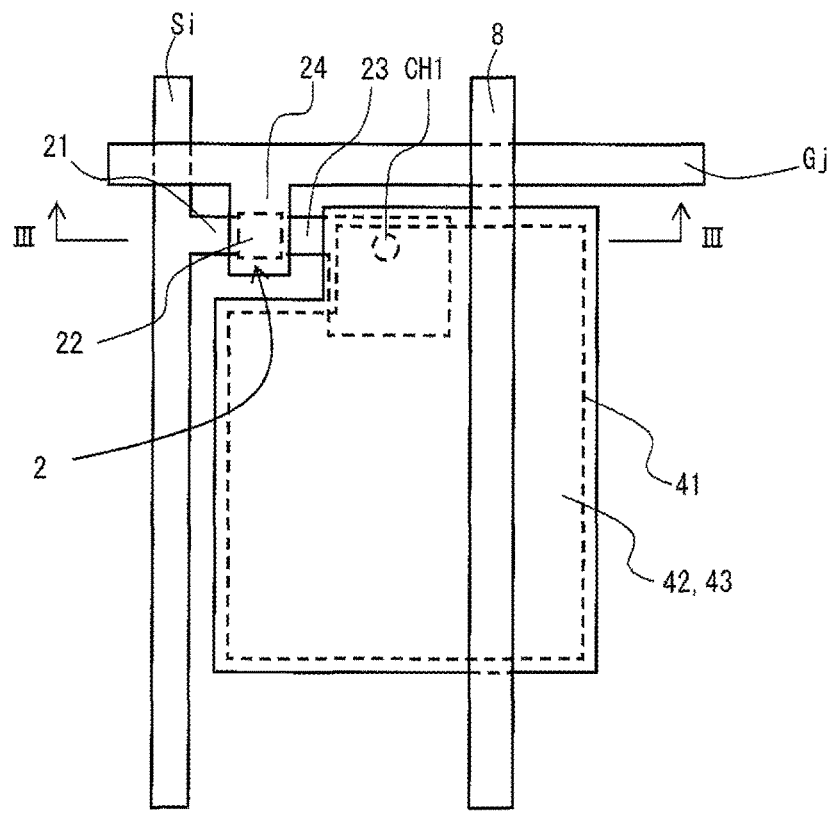
FIG. 2 is a view in a direction perpendicular to the substrate, depicting an exemplary configuration of a sensor unit.
Figure 3:
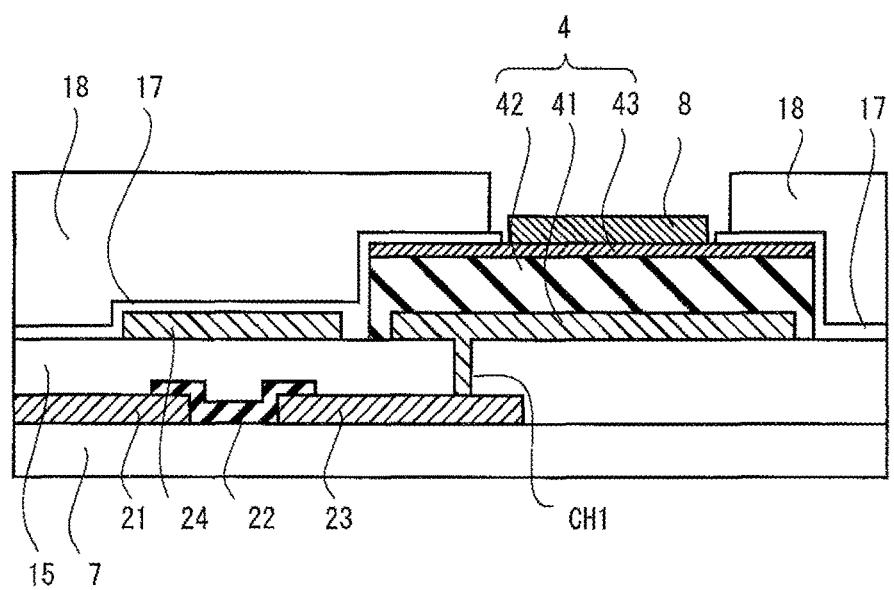
FIG. 3 is a sectional view taken along line indicated in FIG. 2.

FIG. 2 is a view in the direction perpendicular to the substrate, depicting an exemplary configuration of the sensor unit 1. FIG. 3 is a sectional view taken along line III-III indicated in FIG. 2. FIG. 2 depicts the configuration of the sensor unit 1 disposed correspondingly to the intersection point of an i-th data line Di and a j-th gate line Gj.

The TFT 2 is positioned correspondingly to the intersection point of the data line Di and the gate line Gj. The TFT 2 includes a source electrode 21, a drain electrode 23, a semiconductor layer 22, and a gate electrode 24. The source electrode 21 is connected to the data line Di. The drain electrode 23 is connected to the lower electrode 41. The source electrode 21, the semiconductor layer 22, and the drain electrode 23 are disposed at an identical layer level. The source electrode 21 is provided integrally with the data line Di.

The source electrode 21 and the drain electrode 23 face each other in a direction parallel to the substrate. The semiconductor layer 22 has an area between the source electrode 21 and the drain electrode 23. The gate electrode 24 is positioned to be overlapped with the semiconductor layer 22 when viewed along the normal line of the substrate. The gate electrode 24 is connected to the gate line Gj. The gate electrode 24 is provided integrally with the gate line Gj.

The lower electrode 41 is provided in an area surrounded with the data line Di, a data line Di+1 (not depicted) adjacent thereto, the gate line Gj, and a gate line Gj+1 (not depicted) adjacent thereto. The semiconductor film 42 and the upper electrode 43 of the photodiode 4 are provided to be overlapped with the lower electrode 41 in this area.

There is provided a bias line 8 overlapped with the upper electrode 43. The bias line 8 is disposed to be connected with the upper electrode 43. The bias line 8 extends along the data line Di to outside the sensor area SA, and is connected also to the upper electrodes 43 of the other sensor units 1 aligned along the bias line. The bias line 8 is configured to apply reverse bias voltage to the semiconductor film 42.

As depicted in FIG. 3, the source electrode 21 and the drain electrode 23 of the TFT 2 are provided on a substrate 7 and face each other. The semiconductor layer 22 is provided on the substrate 7 and extends from an end of the source electrode 21 to an end of the drain electrode 23 facing the end of the source electrode 21. In this exemplary case, the semiconductor layer 22 has a surface close to the substrate 7 and having ends in contact with surfaces far from the substrate 7, of the end of the source electrode 21 and the end of the drain electrode 23. In other words, the ends of the semiconductor layer 22 are provided over the end of the source electrode 21 and the end of the drain electrode 23.

The semiconductor layer 22 can be made of an oxide semiconductor or a silicon semiconductor. The oxide semiconductor can include an In—Ga—Zn—O system semiconductor mainly containing indium, gallium, zinc, and oxygen. The In—Ga—Zn—O system semiconductor can include a portion made of a crystalline substance. The oxide semiconductor will be specifically exemplified later.

The source electrode 21, the semiconductor layer 22, and the drain electrode 23 have surfaces, which are far from the substrate 7 and are covered with a gate insulating film 15. The source electrode 21, the semiconductor layer 22, and the drain electrode 23 are thus disposed between the gate insulating film 15 and the substrate 7. The gate electrode 24 is disposed to face the semiconductor layer 22 with the gate insulating film 15 interposed therebetween. The gate electrode 24 is provided on the gate insulating film 15 and is positioned to be overlapped with the semiconductor layer 22 when viewed along the normal line of the substrate 7.

In this exemplary case, the gate electrode 24 is overlapped with the entire semiconductor layer 22 when viewed along the normal line of the substrate 7. The gate electrode 24 can be provided to be overlapped, when viewed along the normal line of the substrate 7, with at least a portion of the semiconductor layer 22 between the source electrode 21 and the drain electrode 23. In other words, the gate electrode 24 can be overlapped with at least a portion serving as a channel area of the semiconductor layer 22 when viewed along the normal line of the substrate 7.

The gate insulating film 15 is provided thereon with the lower electrode 41, the semiconductor film 42, and the upper electrode 43 stacked in the mentioned order. The lower electrode 41 is provided on the gate insulating film 15. The lower electrode 41 and the gate electrode 24 are thus disposed at an identical layer level. The lower electrode 41 is provided at a different layer level from the source electrode 21, the semiconductor layer 22, and the drain electrode 23, with the gate insulating film 15 interposed therebetween. The lower electrode 41 partially faces the drain electrode 23 with the gate insulating film 15 interposed therebetween.

The gate insulating film 15 has a contact hole CH1 provided in a portion between the lower electrode 41 and the drain electrode 23. The lower electrode 41 is connected to the drain electrode 23 via the contact hole CH1 in the gate insulating film 15.

The contact hole CH1 has an area smaller than that of the lower electrode 41 when viewed along the normal line of the substrate 7. The contact hole CH1 can alternatively have an area substantially equal to or larger than that of the lower electrode 41 when viewed along the normal line of the substrate 7. In the latter case, the lower electrode 41 can be provided at an identical layer level with the source electrode 21, the semiconductor layer 22, and the drain electrode 23. The lower electrode 41 can be a conductor provided integrally with the drain electrode 24 in this configuration.

The lower electrode 41 is provided thereon with the semiconductor film 42 in contact with the lower electrode 41. The upper electrode 43 is provided on the semiconductor film 42. The upper electrode 43 thus faces the lower electrode 41 with the semiconductor film 42 interposed therebetween. The upper electrode 43 is provided thereon with the bias line 8.

The semiconductor film 42 can include an n-type (n+) semiconductor layer, an i-type semiconductor layer, and a p-type (p+) semiconductor layer stacked in the mentioned order. These semiconductor layers can be made of amorphous silicon or the like. The upper electrode 43 can be a transparent electrode made of ITO, IZO, ZnO, SnO, or the like.

The gate insulating film 15 is provided thereon with a passivation layer 17 covering the gate electrode 24 and part of the photodiode 4. The passivation layer 17 extends from above the TFT 2 to an end (edge) of the photodiode 4. The passivation layer 17 is provided thereon with a flattening film 18. The flattening film 18 and the passivation layer 17 have an opening in a portion covering the upper electrode 43. The bias line 8 is provided in the opening.

FIGS. 2 and 3 exemplify the gate electrode 24 that is disposed farther from the substrate 7 than the semiconductor layer 22 and faces the semiconductor layer 22 with the gate insulating film 15 interposed therebetween. In other words, the gate electrode 24 is not disposed between the semiconductor layer 22 and the substrate 7. The gate electrode 24 is disposed above the semiconductor layer 22 and the gate insulating film 15. Increase in thickness of the gate electrode 24 and the line will not adversely affect performance of the TFT 2 in this configuration. In other words, height difference caused by the thickness of the gate electrode 24 will affect neither the channel area of the semiconductor layer 22 nor the gate insulating film 15, which are provided below the gate electrode 24. The gate electrode 24 and the gate line G are thus enhanced in design flexibility of thickness thereof. This enables improvement in sensor performance of the photosensor substrate 10.

For example, resistance can be reduced by increase in thickness of the gate electrode 24 and/or the gate line G. This facilitates reduction in size of the TFT 2, reduction in width of the line, and the like. This further secures performance and yield enabling improvement in definition.

In the above exemplary case, the gate electrode 24 is disposed on the gate insulating film 15 to face the semiconductor layer 22, and the lower electrode 41 of the photodiode 4 is connected to the drain electrode via the contact hole in the gate insulating film 15. The gate electrode 24 in this configuration can serve as an etch stopper for the gate insulating film 15 in a step of forming the semiconductor film 42 of the photodiode 4 (e.g. an etching step). The gate electrode 24 can further inhibit storage of electric charges on the gate insulating film 15 in the step of forming the semiconductor film 42 (e.g. a dry etching step).

The above configuration reduces damage to the semiconductor layer 22 of the TFT 2 in the step of forming the semiconductor film 42 of the photodiode 4. This leads to inhibited change in property of the TFT 2 and reduced variation in property of the TFTs 2. The photosensor substrate thus configured can accordingly achieve excellent reliability.

In the above exemplary case, the semiconductor layer 22 of the TFT 2 has the surface close to the substrate 7 and in contact with the surfaces far from the substrate 7, of the end of the source electrode 21 and the end of the drain electrode 23 facing each other. In other words, the semiconductor layer 22 is provided over the source electrode 21 and the drain electrode 23. This configuration prevents damage to the semiconductor layer 22 of the TFT 2 in a step of forming the source electrode 21 and the drain electrode 23 (e.g. an etching step). Increase in thickness of the source electrode 21 or the drain electrode 23 will thus not adversely affect the performance of the TFT 2.

The gate electrode 24 is disposed to be overlapped with the semiconductor layer 22 when viewed along the normal line of the substrate 7, so that the gate electrode 24 blocks light incident on the semiconductor layer 22 from above the substrate 7. This configuration thus achieves more stabilization of the property of the TFT 2.

The gate electrode 24 of the TFT 2 and the lower electrode 41 of the photodiode 4 are configured by conductors at an identical layer level. This configuration enables simplification of the production steps.

(Production Steps)

FIGS. 4A to 4G are views depicting exemplary steps of producing the photosensor substrate according to the present embodiment. FIGS. 4A to 4G each depict a cross section of a portion provided with the sensor unit 1.

<Substrate>

Figure 4A:
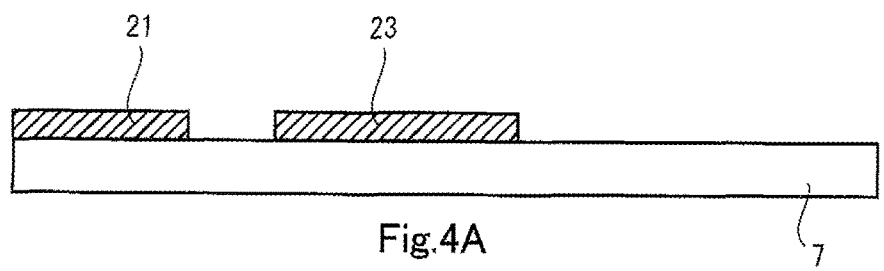
FIG. 4A is a view depicting an exemplary step of producing the photosensor substrate.

In order to reach the state depicted in FIG. 4A, the source electrode 21, the data line D (not depicted in FIG. 4A), and the drain electrode 23 are initially formed on the substrate 7. Examples of the material for the substrate 7 include a glass substrate, a silicon substrate, a heat-resistant plastic substrate, and a resin substrate. The plastic substrate or the resin substrate can be made of polyethylene terephthalate (PET), polyethylene naphthalate (PEN), polyether sulfone (PES), acryl, polyimide, or the like.

<Formation of Base Coating Film>

In order to prevent diffusion of impurities and the like from the substrate 7, the entire substrate 7 can be provided thereon with an insulating film (not depicted) of about 100 to 300 nm thick as a base coating film. The base coating film can be made of an insulating material such as silicon nitride, silicon oxide, silicon nitrided oxide, or silicon oxidized nitride, and can be formed in accordance with a thin film forming method such as the plasma CVD method or the sputtering method. The base coating film is not limited to have a single layer structure but can have two or more layers. Furthermore, the entire substrate is optionally heat treated.

<Formation of Source/Drain Electrode>

The base coating film is provided thereon with a conductive film of 300 to 800 nm thick to configure the drain electrode 23 and the source electrode 21. The conductive film can be made of a material appropriately selected from among metals such as aluminum (Al), tungsten (W), molybdenum (Mo), tantalum (Ta), copper (Cu), chromium (Cr), and titanium (Ti), alloys thereof, and metal nitrides thereof. The conductive film can optionally include a plurality of layers made of these materials.

In an exemplary case, films of Ti of 100 nm thick, Al of 300 nm thick, and Ti of 50 nm thick are formed in the mentioned order in accordance with the sputtering method and are then processed to have a desired pattern in accordance with the photolithography method and by dry etching.

<Formation of Oxide Semiconductor>

Figure 4B:
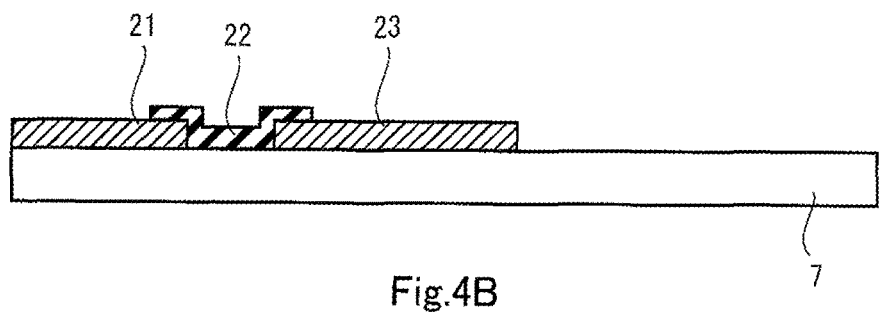
FIG. 4B is a view depicting an exemplary step of producing the photosensor substrate.

The base coating film is provided thereon with the semiconductor layer 22 covering the source electrode 21 and the drain electrode 23 (see FIG. 4B).

The semiconductor layer 22 includes an In—Ga—Zn—O system semiconductor or the like (hereinafter, simply referred to as the "In—Ga—Zn—O semiconductor"). The In—Ga—Zn—O semiconductor is ternary oxide including indium (In), gallium (Ga), and zinc (Zn), with particularly unlimited ratios (composition ratios) of In, Ga, and Zn. Examples of their ratios include In:Ga:Zn=2:2:1, In:Ga:Zn=1:1:1, and In:Ga:Zn=1:1:2. The semiconductor layer 22 can include InGaO3(ZnO)5 or the like.

A TFT including an In—Ga—Zn—O semiconductor layer has high mobility (more than 20 times of that of an amorphous silicon (a-Si) TFT) and low leakage current (less than one hundredth of that of the a-Si TFT). Such a TFT is preferably applicable as a drive TFT or a pixel TFT. The TFT including the In—Ga—Zn—O semiconductor layer has such high mobility and thus enables reduction in size of the TFT. Application of the TFT including the In—Ga—Zn—O semiconductor layer enables significant reduction in electric power consumption of a photodetection system and/or improvement in resolution of the photodetection system.

The In—Ga—Zn—O semiconductor can be amorphous (noncrystalline) or include a portion made of a crystalline substance. Such an In—Ga—Zn—O semiconductor containing a crystalline substance preferably has a c axis oriented substantially perpendicular to a layer surface. JP 2012-134475 A and the like disclose a crystalline structure of such an In—Ga—Zn—O semiconductor. The entire contents disclosed in JP 2012-134475 A are herein incorporated by reference.

The semiconductor layer 22 can include any other oxide semiconductor in place of the In—Ga—Zn—O semiconductor. The semiconductor layer 22 can include a Zn—O semiconductor (ZnO), an In—Zn—O semiconductor (IZO (registered trademark)), a Zn-Ti—O semiconductor (ZTO), a Cd—Ge—O semiconductor, a Cd—Pb—O semiconductor, CdO (cadmium oxide), an Mg—Zn—O semiconductor, an In—Sn—Zn—O semiconductor (e.g. In2O3-SnO2-ZnO), an In—Ga—Sn—O semiconductor, or the like.

The Zn—O semiconductor can be a semiconductor containing ZnO with no additive of any impurity element, or ZnO with an additive of an impurity. The Zn—O semiconductor can be a semiconductor including an additive of one or a plurality of impurity elements in Groups 1, 13, 14, 15, and 17. The Zn—O semiconductor can contain a magnesium zinc oxide (MgxZn1-xO), a cadmium zinc oxide (CdxZn1-xO), or the like. The Zn—O semiconductor can be in an amorphous (noncrystalline) state, in a polycrystalline state, or in a microcrystalline state mixedly including the noncrystalline state and the polycrystalline state.

The semiconductor layer 22 can include any other semiconductor in place of the oxide semiconductor. The semiconductor layer 22 can include amorphous silicon, polycrystal silicon, low-temperature polysilicon, or the like.

The semiconductor layer 22 is typically 30 to 100 nm thick. The semiconductor layer 22 is exemplarily provided by forming a semiconductor film in accordance with the sputtering method and then processing the semiconductor film to have a predetermined shape (pattern) through photolithography processing including etching with use of a resist mask.

<Formation of Gate Insulating Film>

The gate insulating film 15 is subsequently formed to have two stacked layers and cover the source electrode 21, the semiconductor layer 22, and the drain electrode 23 (see FIG. 4C). The gate insulating film 15 can be invade of a material appropriately selected from among a silicon oxide (SiOx), a silicon nitride (SiNx), a silicon oxidized nitride (SiOxNy) (x>y), a silicon nitrided oxide (SiNxOy) (x>y), and the like. In an exemplary case, the lower layer of the gate insulating film 15 can be made of a silicon oxide (SiOx), a silicon oxidized nitride (SiOxNy) (x>y), or the like, whereas the upper layer of the gate insulating film 15 can be made of a silicon nitride (SiNx), a silicon nitrided oxide (SiNxOy) (x>y), or the like. A rare-gas element like argon contained in reactant gas can be mixed into the insulating film. The insulating film thus obtained achieves denseness with low film forming temperature and small gate leakage current.

The gate insulating film 15 is exemplarily formed by continuously depositing SiO2=10 nm and SiN=325 nm with use of CVD equipment. The gate insulating film 15 is then provided with a resist mask in a photolithography step, and is provided with a contact hole by etching.

<Formation of Gate Electrode and Lower Electrode>

Figure 4C:
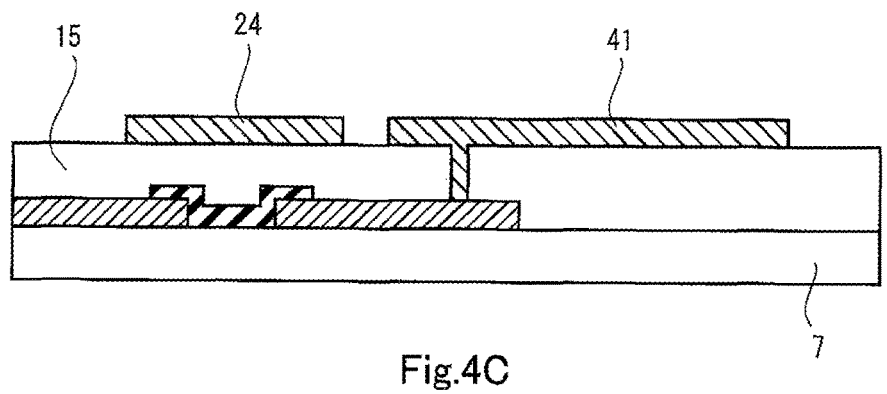
FIG. 4C is a view depicting an exemplary step of producing the photosensor substrate.
Figure 4D:
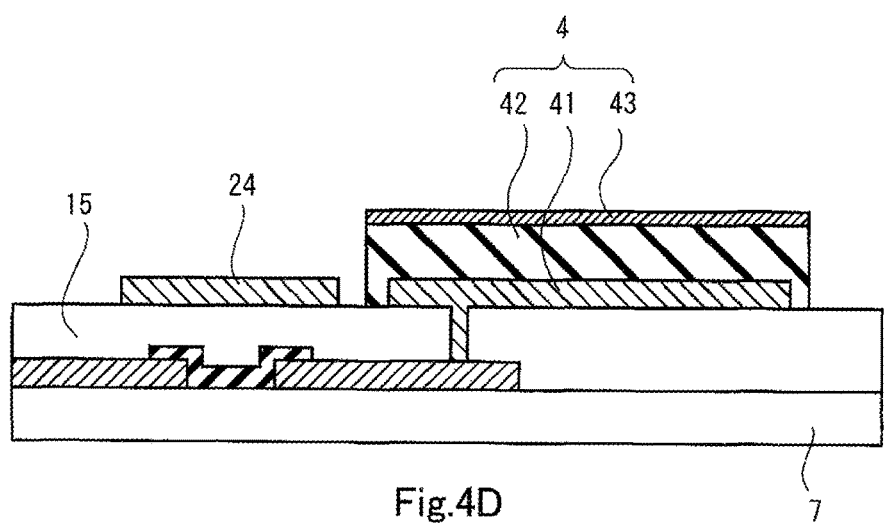
FIG. 4D is a view depicting an exemplary step of producing the photosensor substrate.

The gate insulating film 15 is provided thereon with a conductive film to configure the gate electrode 24 and the lower electrode 41 (see FIG. 4C). The conductive film is formed to be typically 300 to 800 nm thick. The conductive film can be made of a material appropriately selected from among metals such as aluminum (Al), tungsten (W), molybdenum (Mo), tantalum (Ta), copper (Cu), chromium (Cr), and titanium (Ti), alloys thereof, and metal nitrides thereof. The conductive film can optionally include a plurality of layers made of these materials.

In an exemplary case, films of Ti of 100 nm thick, Al of 300 nm thick, and Ti of 50 nm thick are formed in accordance with the sputtering method and are then processed to have a desired pattern in accordance with the photolithography method and by dry etching. The gate electrode 24 and the lower electrode 41 are thus obtained.

<Formation of Semiconductor Film and Upper Electrode of Photodiode>

The entire substrate 7 is provided thereon with an n-type semiconductor layer, an i-type semiconductor layer, and a p-type semiconductor layer in the mentioned order in accordance with the CVD method or the like, to cover the gate insulating film 15, the gate electrode 24, and the lower electrode 41. These semiconductor layers configure the semiconductor film 42 (see FIG. 4D). A film made of a transparent conductive material such as IZO or ITO is subsequently formed in accordance with the sputtering method, in an area including the area provided with the semiconductor film 42. The transparent conductive material serves as a conductor for the upper electrode 43. The film is then processed to have a predetermined shape (pattern) through photolithography processing and dry etching to configure the semiconductor film 42 and the upper electrode 43. The photodiode 4 thus obtained includes the lower electrode 41, the semiconductor film 42, and the upper electrode 43 being stacked.

The n-type semiconductor layer in the semiconductor film 42 is made of noncrystalline silicon (amorphous silicon: a-Si) or the like and configures an n+ area. The n-type semiconductor layer is typically 40 to 50 nm thick. The i-type semiconductor layer can be a non-doped intrinsic semiconductor layer or the like with less conductivity than the n-type semiconductor layer and the p-type semiconductor layer, and is made of noncrystalline silicon (a-Si) or the like. The i-type semiconductor layer is typically about 500 nm to 1500 nm thick, and achieves higher optical sensitivity with larger thickness. The p-type semiconductor layer is made of noncrystalline silicon (a-Si) or the like, and configures a p+ area. The p-type semiconductor layer is typically 10 nm to 50 nm thick.

<Formation of Passivation Film and Flattening Film>

Figure 4E:
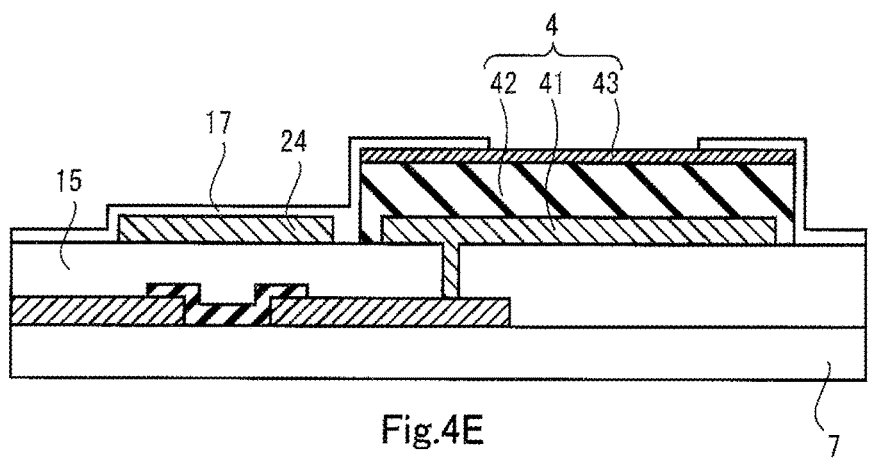
FIG. 4E is a view depicting an exemplary step of producing the photosensor substrate.

There is formed a passivation film 17 covering the gate insulating film 15, the gate electrode 24, and the photodiode 4 (see FIG. 4E). The passivation film 17 is typically about 200 to 500 nm thick. The passivation film 17 can be made of an insulating material such as silicon nitride, silicon oxide, silicon nitrided oxide, or silicon oxidized nitride, and can be formed in accordance with a thin film forming method such as the plasma CVD method or the sputtering method. The passivation film 17 is not limited to have a single layer structure but can have two or more layers.

Figure 4F:
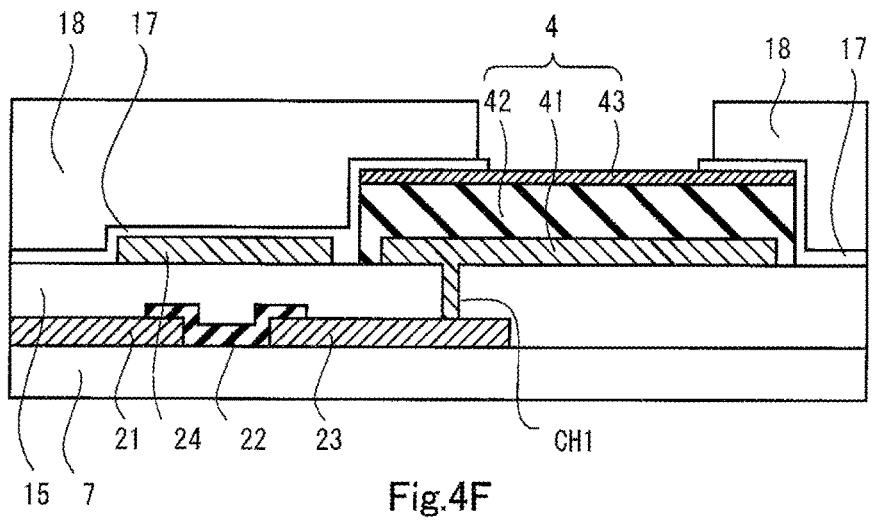
FIG. 4F is a view depicting an exemplary step of producing the photosensor substrate.

The passivation film 17 is provided thereon with the flattening film 18 (see FIG. 4F). The flattening film 18 can be made of photosensitive resin. Patterning can be performed with no use of any photoresist in this case. The flattening film 18 and the passivation film 17 have an opening in an area to be provided with the photodiode.

<Formation of Bias Line>

Figure 4G:
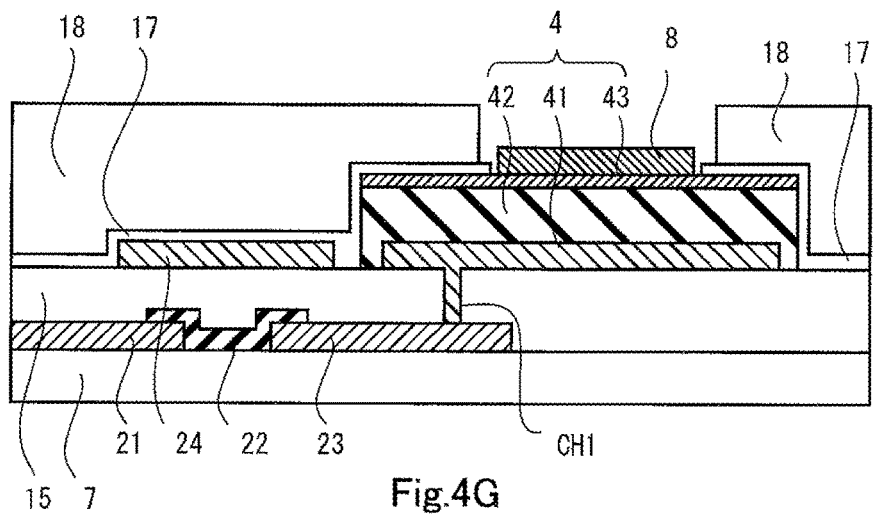
FIG. 4G is a view depicting an exemplary step of producing the photosensor substrate.

The bias line 8 is formed in the opening of the flattening film 18 and the passivation film 17 (FIG. 4G). The bias line 8 is formed by patterning, in accordance with the sputtering method and the photolithography method, a line layer including a conductive film made of Al, Mo, Ti, or the like and a transparent conductive film made of IZO. ITO, or the like being stacked.

The photosensor substrate obtained as described above is provided thereon with a wavelength conversion layer (not depicted). The wavelength conversion layer is typically made of a scintillator. The photosensor substrate provided with the wavelength conversion layer can configure a radiation imaging device.

In the above production steps, the semiconductor film 42 of the photodiode 4 is thicker than the semiconductor layer 22 of the TFT 2. The step of forming the semiconductor film 42 of the photodiode 4 thus takes relatively long time for etching. Furthermore, uneven (varied) thickness of the layer to be etched or a deposition film may lead to etching of a layer below the layer to be etched (overetching) in the etching step.

The inventor has recognized that, in a case where the gate electrode 24 provided on the gate insulating film 15 does not face the semiconductor layer 22 of the TFT 2, the semiconductor layer 22 of the TFT 2 is damaged (e.g. etching damage) in the step of forming the photodiode 4 to change the property of the TFT. Examples of such change in property of the TFT 2 include increase in off-state current (leakage current) and threshold voltage shift. The inventor has found that deterioration in reliability due to TFT property change tends to be problematic particularly in a case where dry etching is performed in the step of forming the photodiode and the above oxide semiconductor is adopted as the material for the semiconductor layer (active layer) of the TFT.

Dry etching is likely to cause larger process damage than wet etching. The TFT including the oxide semiconductor as the material for the semiconductor layer tends to cause larger property change by heat treatment or concentration change of hydrogen contained in a film in contact with the semiconductor layer, than a TFT including a silicon semiconductor.

For example, the gate electrode 24 in a conventional photosensor substrate is not disposed on the insulating film covering the semiconductor layer 22 of the TFT 2. In this case, the semiconductor layer of the photodiode can receive damage (process damage) by etching of the insulating film or storage of electric charges (charge-up) on the insulating film in the etching step for formation of the semiconductor film. Damage to the semiconductor layer can cause initial variation in property of the TFTs. Change or variation in property of the TFTs can lead to insufficient reliability of the photosensor substrate.

In contrast, the present embodiment achieves stabilization of the TFT property and secured reliability of the photosensor substrate even in the case where dry etching is performed in the step of forming the photodiode and the semiconductor layer of the TFT is made of an oxide semiconductor.

<Embodiment 2>

Figure 5:
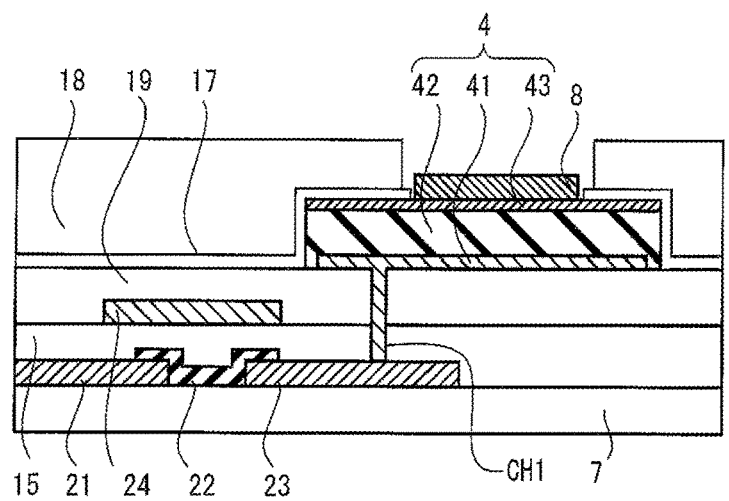
FIG. 5 is a sectional view of a sensor unit according to an embodiment 2.

FIG. 5 is a sectional view of a sensor unit 1 according to the present embodiment. FIG. 5 depicts a configuration including the configuration depicted in FIG. 3 and an interlayer insulating film 19 additionally provided on the gate insulating film 15. The gate insulating film 15 according to the present embodiment is provided thereon with the interlayer insulating film 19 covering the gate electrode 24. The lower electrode 41 of the photodiode 4 is provided on the interlayer insulating film 19. The lower electrode 41 is connected to the drain electrode 23 via the contact hole CH1 provided in the interlayer insulating film 19 and the gate insulating film 15. The gate electrode 24 and the lower electrode 41 are disposed at different layer levels.

The gate insulating film 15, the gate electrode 24, and the interlayer insulating film 19 are disposed between the layer provided with the photodiode 4 and the layer provided with the TFT 2. This configuration thus further inhibits overetching of the gate insulating film 15 on the semiconductor layer 22 during etching for formation of the photodiode 4 or charge-up thereon.

Figure 6A:
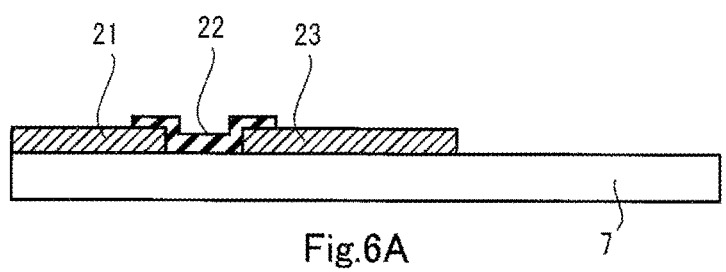
FIG. 6A is a view depicting an exemplary step of producing a photosensor substrate according to the embodiment 2.

FIGS. 6A to 6E are views depicting exemplary steps of producing the photosensor substrate including the sensor units 1 configured as depicted in FIG. 5. As depicted in FIG. 6A, the source electrode 21, the semiconductor layer 22, and the drain electrode 23 are formed on the substrate 7. These portions can be formed similarly to those according to the embodiment 1.

Figure 6B:
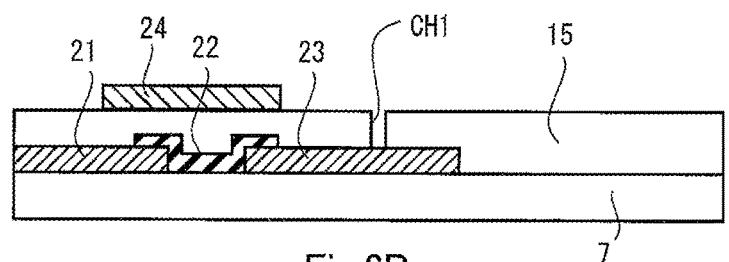
FIG. 6B is a view depicting an exemplary step of producing the photosensor substrate according to the embodiment 2.
Figure 6C:
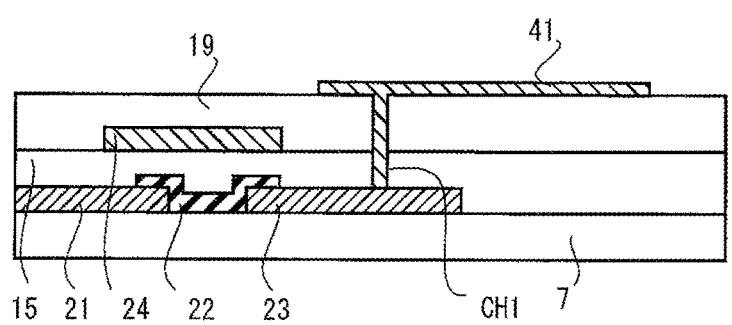
FIG. 6C is a view depicting an exemplary step of producing the photosensor substrate according to the embodiment 2.

As depicted in FIG. 6B, the gate electrode 24 is formed on the gate insulating film 15 covering the substrate 7, the source electrode 21, the semiconductor layer 22, and the drain electrode 23. As depicted in FIG. 6C, the interlayer insulating film 19 is formed to cover the gate insulating film 15 and the gate electrode 24.

The interlayer insulating film 19 is typically about 200 to 600 nm thick. The interlayer insulating film 19 can be made of an insulating material such as silicon nitride, silicon oxide, silicon nitrided oxide, or silicon oxidized nitride, and can be formed in accordance with a thin film forming method such as the plasma CVD method or the sputtering method. The interlayer insulating film 19 is not limited to have a single layer structure but can have two or more layers. Furthermore, the entire substrate is optionally heat treated.

The interlayer insulating film 19 and the gate insulating film 15 have the contact hole CH1. The lower electrode 41 of the photodiode 4 is formed to be connected with the drain electrode 23 via the contact hole CH1 thus opened (see FIG. 6C).

The lower electrode 41 is provided by forming a conductive film on the interlayer insulating film 19 and processing the conductive film to have a desired shape with use of a resist mask in the photolithography step. The conductive film can be made of a material appropriately selected from among metals such as aluminum (Al), tungsten (W), molybdenum (Mo), tantalum (Ta), copper (Cu), chromium (Cr), and titanium (Ti), alloys thereof, and metal nitrides thereof. The conductive film thus formed can be patterned typically in accordance with the photolithography method and by dry etching.

Figure 6D:
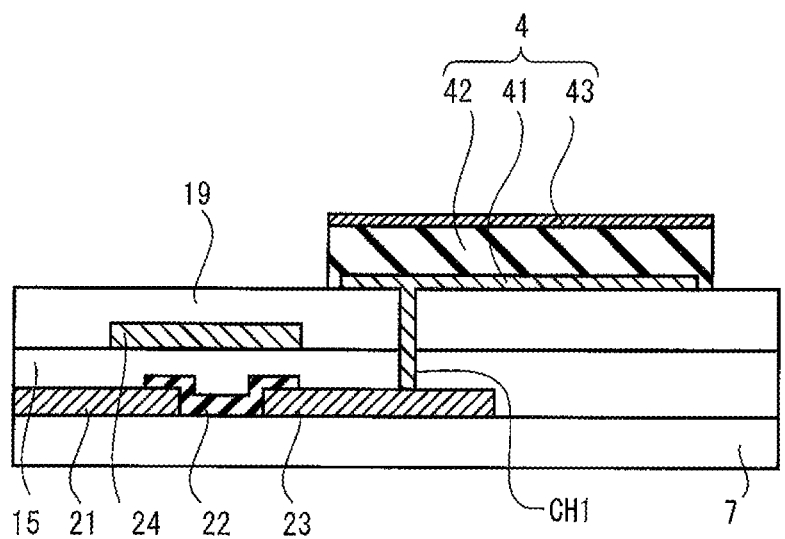
FIG. 6D is a view depicting an exemplary step of producing the photosensor substrate according to the embodiment 2.
Figure 6E:
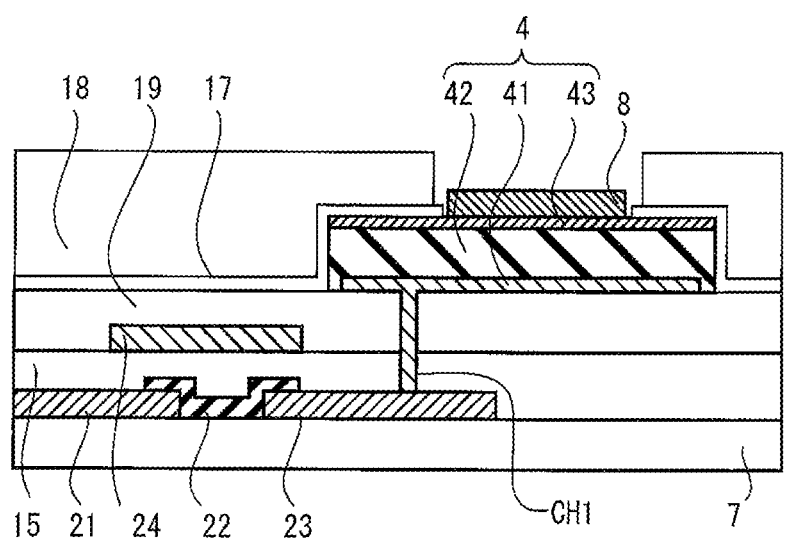
FIG. 6E is a view depicting an exemplary step of producing the photosensor substrate according to the embodiment 2.

The lower electrode 41 is provided thereon with the semiconductor film 42 and the upper electrode 43 (see FIG. 6D). The interlayer insulating film 19 is provided thereon with the passivation film 17 and the flattening film 18 covering the photodiode 4 (see FIG. 6E). The passivation film 17 and the flattening film 18 are provided with an opening, and the bias line 8 is formed in the opening.

<Embodiment 3>

Figure 7:
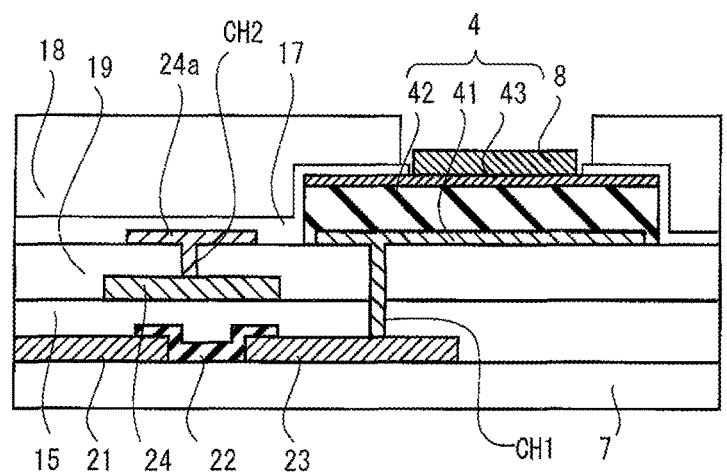
FIG. 7 is a sectional view of a sensor unit according to an embodiment 3.

FIG. 7 is a sectional view of a sensor unit 1 according to the present embodiment. FIG. 7 depicts a configuration including the configuration depicted in FIG. 5 and an extended gate electrode 24 additionally provided on the interlayer insulating film 19 and positioned to face the gate electrode 24. The extended gate electrode 24a is connected to the gate electrode 24 via a contact hole CH2 provided in the interlayer insulating film 19. The extended gate electrode 24a is configured by a conductor at an identical layer level with the lower electrode 41.

The extended gate electrode 24a is positioned to be overlapped with the gate electrode 24 when viewed along the normal line of the substrate 7. The extended gate electrode 24a is substantially equal in area to the gate electrode 24 in this example, but can alternatively be different therefrom. Part of the extended gate electrode 24a and part of the gate electrode 24 can be overlapped with each other when viewed along the normal line of the substrate 7.

Figure 8A:
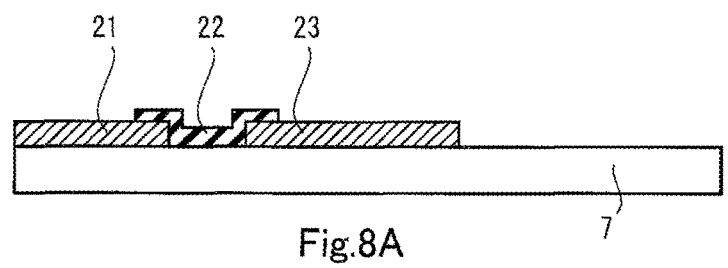
FIG. 8A is a view depicting an exemplary step of producing a photosensor substrate according to the embodiment 3.

FIGS. 8A to 8E are views depicting exemplary steps of producing the photosensor substrate including the sensor units 1 configured as depicted in FIG. 7. As depicted in FIG. 8A, the source electrode 21, the semiconductor layer 22, and the drain electrode 23 are formed on the substrate 7. These portions can be formed similarly to those according to the embodiment 1.

Figure 8B:
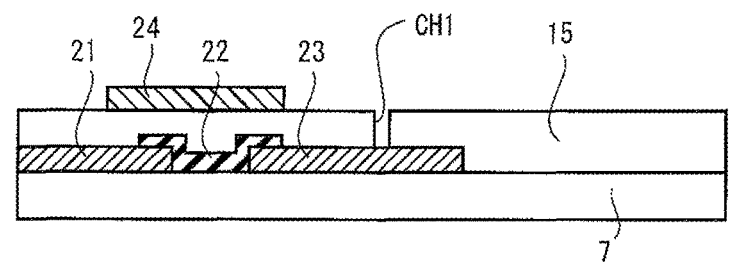
FIG. 8B is a view depicting an exemplary step of producing the photosensor substrate according to the embodiment 3.
Figure 8C:
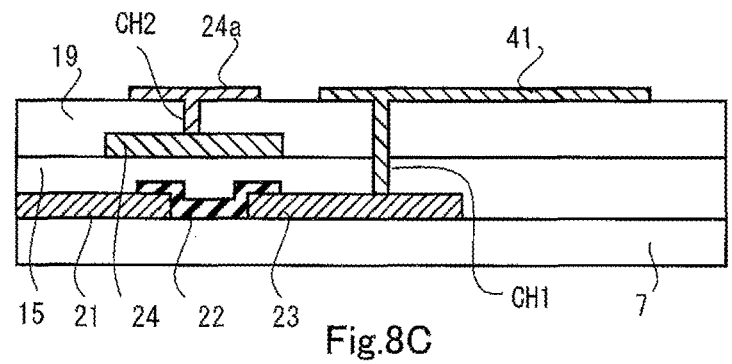
FIG. 8C is a view depicting an exemplary step of producing the photosensor substrate according to the embodiment 3.

As depicted in FIG. 8B, the gate electrode 24 is formed on the gate insulating film 15 covering the substrate 7, the source electrode 21, the semiconductor layer 22, and the drain electrode 23. As depicted in FIG. 8C, the interlayer insulating film 19 is formed to cover the gate insulating film 15 and the gate electrode 24.

The contact hole CH1 is provided in the interlayer insulating film 19 and the gate insulating film 15 in part of the area overlapped with the drain electrode 23. The lower electrode 41 of the photodiode 4 is formed to be connected with the drain electrode 23 via the contact hole CH1 thus opened (see FIG. 8C).

The contact hole CH2 is provided in the interlayer insulating film 19 in part of the area overlapped with the gate electrode 24. The extended gate electrode 24a is formed to be connected to the gate electrode 24 via the contact hole CH2.

The extended gate electrode 24a and the lower electrode 41 are provided by forming a conductive film on the interlayer insulating film 19 and processing the conductive film to have a desired shape with use of a resist mask in the photolithography step. The extended gate electrode 24a and the lower electrode 41 are thus configured by conductors provided at an identical layer level in an identical step. The conductive film can be made of a material appropriately selected from among metals such as aluminum (Al), tungsten (W), molybdenum (Mo), tantalum (Ta), copper (Cu), chromium (Cr), and titanium (Ti), alloys thereof, and metal nitrides thereof. The conductive film thus formed can be patterned typically in accordance with the photolithography method and by dry etching.

The conductive film formed in the step depicted in FIG. 8C includes the lower electrode 41 of the photodiode 4 and the extended gate electrode 24a connected to the gate electrode 24. The extended gate electrode 24a enables effective increase in thickness of the gate electrode 24 and decrease in line resistance. The gate line G connected to the gate electrode 24 can similarly be provided with an extended gate line.

Figure 8D:
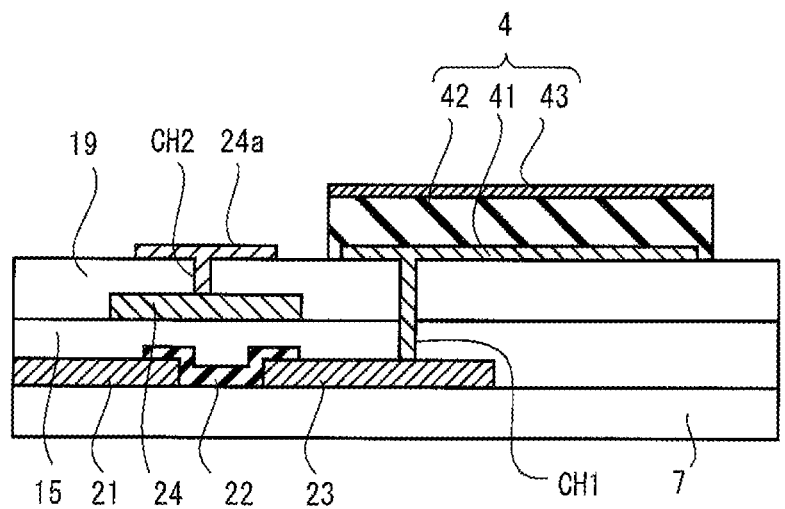
FIG. 8D is a view depicting an exemplary step of producing the photosensor substrate according to the embodiment 3.
Figure 8E:
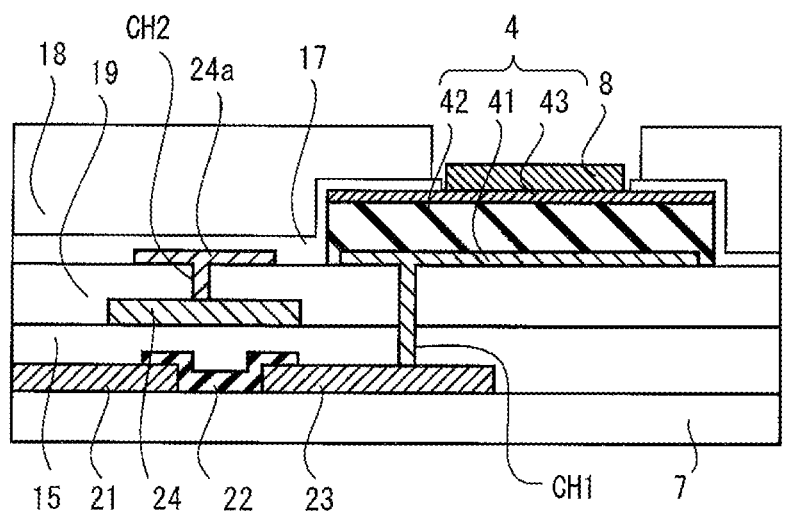
FIG. 8E is a view depicting an exemplary step of producing the photosensor substrate according to the embodiment 3.

The lower electrode 41 is provided thereon with the semiconductor film 42 and the upper electrode 43 (see FIG. 8D). The interlayer insulating film 19 is provided thereon with the passivation film 17 and the flattening film 18 covering the extended gate electrode 24a and the photodiode 4 (see FIG. 8E). The passivation film 17 and the flattening film 18 are provided with an opening, and the bias line 8 is formed in the opening.

Modification Example 1

Figure 9:
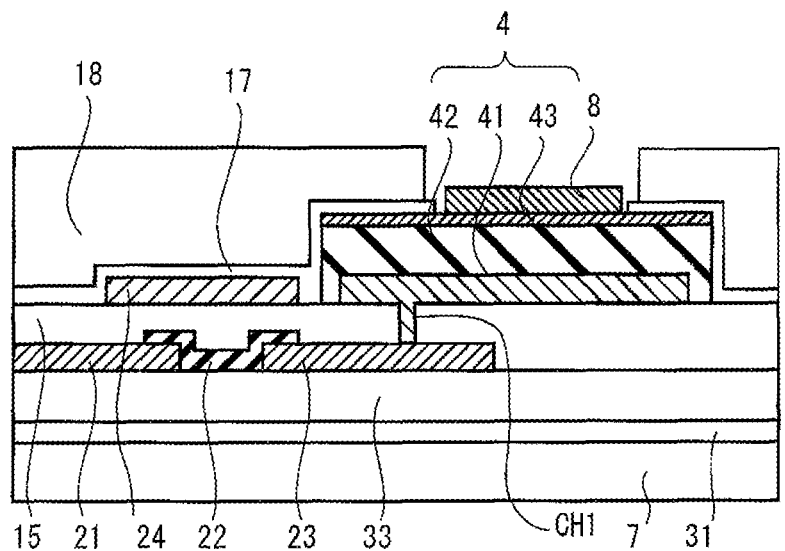
FIG. 9 is a sectional view according to a modification example, corresponding to the configuration depicted in FIG. 1.

FIG. 9 is a sectional view according to a modification example, corresponding to the configuration depicted in FIG. 1. FIG. 9 exemplarily depicts a light shielding film 31 disposed between the substrate 7 and the semiconductor layer 22. The light shielding film 31 is provided on the entire substrate 7. The light shielding film 31 is provided thereon with an insulating film 33. The insulating film 33 is provided thereon with the source electrode 21, the semiconductor layer 22, and the drain electrode 23. The light shielding film 31 blocks light incident on a rear surface of the substrate 7. This configuration prevents light passing through the substrate 7 from adversely affecting the elements like the TFT 2 disposed on the substrate 7.

As in the embodiments 1 to 3, the TFT 2 and the photodiode 4 can sequentially be formed after the light shielding thin film and the insulating film are formed on the substrate 7. The light shielding film 31 can reduce influence of light on the TFT 2 when the light shielding film 31 is positioned to face at least the TFT 2 when viewed along the normal line of the substrate 7. The insulating film 33 can be eliminated depending on the material for the light shielding film 21. The present modification example is applicable to any one of the embodiments 1 to 3.

Modification Example 2

Figure 10:
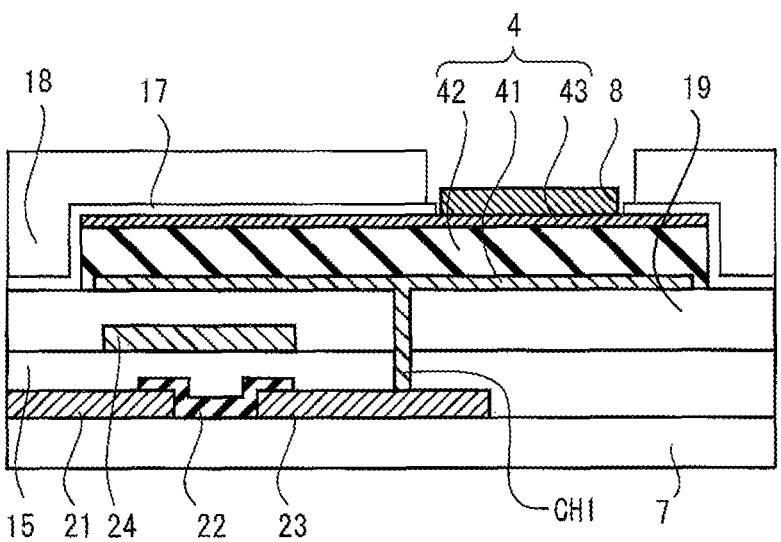
FIG. 10 is a sectional view according to a modification example, corresponding to the configuration depicted in FIG. 5.
Figure 11:
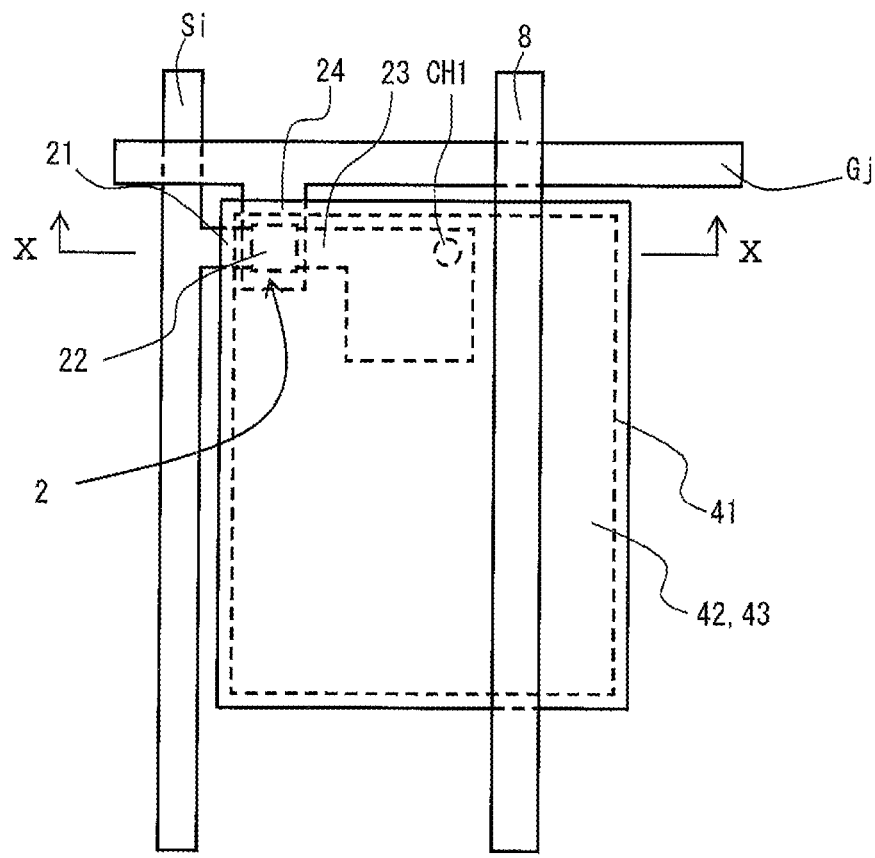
FIG. 11 is a plan view of a sensor unit depicted in FIG. 10.

FIG. 10 is a sectional view according to a modification example, corresponding to the configuration depicted in FIG. 5. FIG. 11 is a plan view along the normal line of the substrate 7, depicting a configuration of a sensor unit depicted in FIG. 10. FIG. 10 is a sectional view taken along line X-X indicated in FIG. 11. FIG. 10 exemplifies the photodiode 4 extended to face the gate electrode 24 with the interlayer insulating film 19 interposed therebetween. The photodiode 4 is disposed on the interlayer insulating film 19 and is partially overlapped with the gate electrode 24 when viewed along the normal line of the substrate 7.

When viewed along the normal line of the substrate 7, at least part of the gate electrode 24 and part of the semiconductor film 42 of the photodiode 4 are overlapped with each other in the area of the semiconductor layer 22 between the source electrode 21 and the drain electrode 23. The gate electrode 24 is disposed between the semiconductor layer 22 of the TFT 2 and the semiconductor film 42 of the photodiode 4 in the direction perpendicular to the substrate 7. The substrate 7 is provided thereon with the semiconductor layer 22, the gate electrode 24, and the photodiode 4 stacked in the mentioned order with the insulating films interposed therebetween. The semiconductor layer 22 of the TFT 2 thus receives neither influence of height difference due to the thickness of the gate electrode 24 nor influence of process damage upon formation of the photodiode 4. This configuration thus achieves more stabilization of the property of the TFT 2.

As depicted in FIG. 11, the entire TFT 2 is overlapped with part of the semiconductor film 42 of the photodiode 4 when viewed along the normal line of the substrate 7 in this example. In other words, the TFT 2 is covered with the photodiode 4. The lower electrode 41, the semiconductor film 42, and the upper electrode 42 are shaped to follow a rectangle defined by the data line Di and the gate line Gj. This achieves an increased light receiving area and improved sensitivity of the photodiode 4.

Modification Example 3

Figure 12:
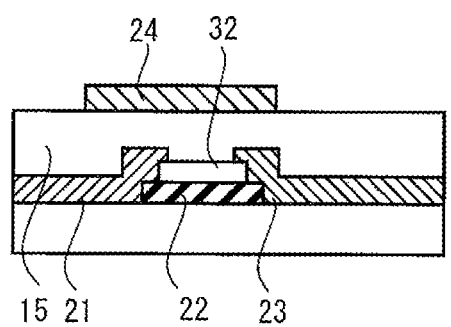
FIG. 12 is a sectional view according to a modification example, corresponding to the configuration of a TFT depicted in FIG. 3.

FIG. 12 is a sectional view according to a modification example, corresponding to the configuration of the TFT 2 depicted in FIG. 3. The TFT 2 depicted in FIG. 12 further includes an insulating layer 32 provided on the surface far from the substrate 7 (hereinafter, referred to as the upper surface), of the semiconductor layer 22. The insulating layer 32 is in contact with an end of the source electrode 21 and an end of the drain electrode 23.

The insulating layer 32 is smaller in width than the semiconductor layer 22. The ends of the semiconductor layer 22 project from the insulating layer 32 in the direction parallel to a plane of the substrate 7. The source electrode 21 and the drain electrode 23 are in contact with the semiconductor layer 22 and the insulating layer 32.

The insulating layer 32 provided on the upper surface of the semiconductor layer 22 can serve as an etch stopper for etching upon formation of the source electrode 21 and the drain electrode 23. The insulating layer 32 thus reduces influence on the TFT 2 in the step of forming the source electrode 21 and the drain electrode 23. The source electrode 21 and the drain electrode 23 are thus enhanced in design flexibility of thickness thereof.

(Exemplary Application to X-Ray Image Detection Device)

Figure 13:
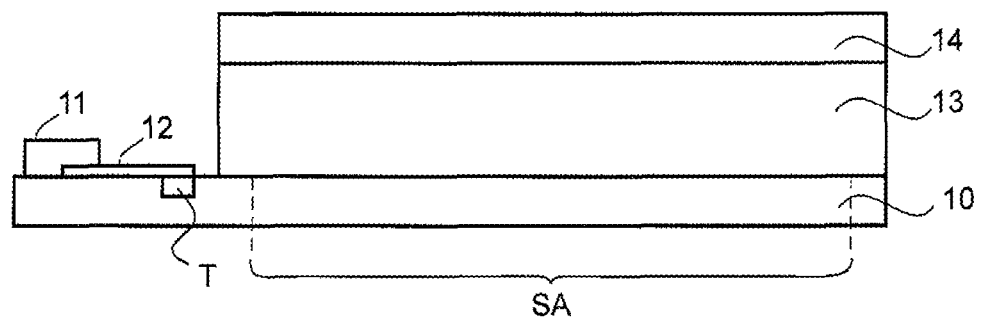
FIG. 13 is a view depicting an exemplary configuration of an X-ray image detection device including the photosensor substrate of FIG. 1.

FIG. 13 is a view depicting an exemplary configuration of an X-ray image detection device including the photosensor substrate 10 of FIG. 1. FIG. 13 depicts a layer configuration in a plane perpendicular to the photosensor substrate 10. The photosensor substrate 10 is provided with a scintillator layer 13 positioned to be overlapped with the sensor area. The scintillator layer 13 can be made of a fluorescent material that converts X-rays to visible rays. Examples of the fluorescent material include cesium iodide (CsI). The scintillator layer 13 can be obtained by direct film formation, such as attachment or vapor deposition, to a surface of the photosensor substrate 10. The scintillator layer 13 can be provided thereon with a protective layer 14 covering the scintillator layer 13. This configuration achieves a flat panel detector (FDP) for an X-ray image.

The terminal parts T of the photosensor substrate 10 are each connected with an electronic component 11 via a line 12. The electronic component 11 can be configured as a semiconductor chip including a circuit configured to process a signal transmitted to the sensor unit 1 or a signal outputted from the sensor unit 1. The circuit connected to the terminal part T is not necessarily mounted to the semiconductor chip. The circuit can be mounted on the photosensor substrate 10 in accordance with the chip on glass (COG) method or the like, or can be provided at each of flexible printed circuits (FPCs) connected to the terminal parts T.

As described above, the embodiments of the present invention relate also to the radiation imaging device including the photosensor substrate and the wavelength conversion layer overlapped with the photosensor substrate.

Other Modification Examples

The invention of the present application is not limited to the embodiments described above. For example, the configuration including the gate electrode 24 and the semiconductor layer 22 facing each other with the gate insulating film 15 interposed therebetween is applicable to a case where at least part of the gate electrode 24 and the portion of the semiconductor layer 22 between the source electrode 21 and the drain electrode 23 face each other with the gate insulating film 15 interposed therebetween.

The photodiode 4 is alternatively connected with a plurality of (two or at least three) TFTs. For example, the TFT including the semiconductor layer made of the oxide semiconductor has high mobility and can thus be adopted as a TFT of an amplifier circuit (e.g. a source follower circuit (a drain grounded circuit)). The amplifier circuit can be formed by disposing a plurality of TFTs in a single pixel.

Each of the sensor units 1 can further have storage capacitance (CS) (not depicted). The photodiode 4 can be connected with the TFT and the storage capacitance. Each pixel can be provided with at least one TFT, at least one photodiode, and at least one storage capacitance.

The photodiode 4 according to each of the above embodiments includes the semiconductor layers of the PIN structure. The photodiode 4 can alternatively have a PI structure, a Schottky structure, or the like. Furthermore, the semiconductor configuring the photodiode 4 and the protective layer 4a is not limited to amorphous silicon. Moreover, the photoelectric transducer can configure an MIS sensor.

The above embodiments each exemplify the photosensor substrate applied to the X-ray image detection device. The photosensor substrate is not limitedly applied thereto. The photosensor substrate according to the present invention is also applicable to any other flat panel optical sensor such as a γ-ray detection device.

REFERENCE SIGN LIST

1 Sensor unit
2 TFT (exemplifying transistor)
21 Source electrode
22 Semiconductor layer
23 Drain electrode
24 Gate electrode
41 Lower electrode
42 Semiconductor film
43 Upper electrode
4 Photodiode (exemplifying photoelectric transducer)
7 Substrate
10 Photosensor substrate
D Data line
G Gate line

The invention claimed is:
1. A photosensor substrate comprising:
a substrate;
a plurality of photoelectric transducers disposed on the substrate; and
transistors connected to the photoelectric transducers, respectively; wherein
the transistors each include
a semiconductor layer supported by the substrate,
a drain electrode and a source electrode facing each other in a direction parallel to a plane of the substrate, with the semiconductor layer interposed therebetween,
a gate insulating film covering the semiconductor layer, the drain electrode, and the source electrode, and
a gate electrode facing the semiconductor layer with the gate insulating film interposed therebetween, and
the photoelectric transducers each include
a lower electrode connected to the drain electrode or the source electrode via a contact hole provided in the gate insulating film,
a semiconductor film in contact with the lower electrode, and
an upper electrode facing the lower electrode with the semiconductor film interposed therebetween,
wherein the gate electrode of the transistor and the lower electrode of the photoelectric transducer are disposed at an identical layer level and made of an identical material.

2. The photosensor substrate according to claim 1, wherein the semiconductor layer of the transistor has a surface close to the substrate and in contact with an end of the source electrode and an end of the drain electrode.

3. The photosensor substrate according to claim 1, wherein
the transistor further includes an insulating layer provided on a surface far from the substrate, of the semiconductor layer, and
the insulating layer is in contact with an end of the source electrode and an end of the drain electrode.

4. The photosensor substrate according to claim 1, further comprising
an interlayer insulating film provided farther from the substrate than the gate insulating film, and covering the gate electrode, wherein
the lower electrode of the photoelectric transducer is provided on a surface far from the substrate, of the interlayer insulating film.

5. The photosensor substrate according to claim 4, further comprising an extended gate electrode disposed at an identical layer level with the lower electrode and connected to the gate electrode via a contact hole provided in the interlayer insulating film.

6. The photosensor substrate according to claim 4, wherein the photoelectric transducer extends to face the gate electrode with the interlayer insulating film interposed therebetween.

7. The photosensor substrate according to claim 1, further comprising a light shielding film provided between the substrate and the transistor.

8. The photosensor substrate according to claim 1, wherein the semiconductor layer of the transistor includes an oxide semiconductor.

9. The photosensor substrate according to claim 1, wherein the gate electrode overlaps with an entire portion of the semiconductor layer when viewed along a normal line of the substrate.

* * * * *